(12) United States Patent
Li et al.

(10) Patent No.: US 11,655,144 B2
(45) Date of Patent: May 23, 2023

(54) METHOD FOR PREPARING MICRO-CAVITY ARRAY SURFACE PRODUCT WITH INCLINED SMOOTH BOTTOM SURFACE BASED ON AIR MOLDING METHOD

(71) Applicant: Jiangsu University, Jiangsu (CN)

(72) Inventors: Jian Li, Jiangsu (CN); Fanlin Zeng, Jiangsu (CN); Lamei Wang, Jiangsu (CN); Rao Fu, Jiangsu (CN); Gang Liu, Jiangsu (CN); Jie Luo, Jiangsu (CN)

(73) Assignee: Jiangsu University, Jiangsu (CN)

( * ) Notice: Subject to any disclaimer, the term of this patent is extended or adjusted under 35 U.S.C. 154(b) by 0 days.

(21) Appl. No.: 17/604,444

(22) PCT Filed: Apr. 28, 2021

(86) PCT No.: PCT/CN2021/090483
§ 371 (c)(1),
(2) Date: Oct. 18, 2021

(87) PCT Pub. No.: WO2022/068191
PCT Pub. Date: Apr. 7, 2022

(65) Prior Publication Data
US 2022/0267144 A1    Aug. 25, 2022

(30) Foreign Application Priority Data

Sep. 29, 2020   (CN) .......................... 202011048792.1

(51) Int. Cl.
*B81C 1/00* (2006.01)
(52) U.S. Cl.
CPC ...... *B81C 1/00031* (2013.01); *B81C 1/00047* (2013.01); *B81C 1/00055* (2013.01);
(Continued)

(58) Field of Classification Search
None
See application file for complete search history.

(56) References Cited

U.S. PATENT DOCUMENTS

| 5,438,421 A | 8/1995 | Sugawara et al. |
| 5,476,700 A | 12/1995 | Asai et al. |
| 2015/0197455 A1 | 7/2015 | Pranov |

FOREIGN PATENT DOCUMENTS

| CN | 101481079 | * 7/2009 | ............... B81C 1/00 |
| CN | 101734612 | 6/2010 | |

(Continued)

OTHER PUBLICATIONS

T.Q. Nguyen and W-T Park, Rapid, low-cost fabrication of circular microchannels by air expansion into partially cured polymer, Sensor and Actuators B, vol. 235, pp. 302-308. (Year: 2016).*

(Continued)

*Primary Examiner* — Jiong-Ping Lu
(74) *Attorney, Agent, or Firm* — JCIP Global Inc.

(57) ABSTRACT

The present invention provides a method for preparing a micro-cavity array surface with an inclined smooth bottom surface based on an air molding method. The method includes: preparing a micro-cavity array surface; preparing an auxiliary microstructure polymer template, and performing plasma treatment on the auxiliary microstructure polymer template; uniformly spreading a layer of a liquid polymer film to be formed on the auxiliary microstructure polymer template subjected to the plasma treatment; placing a gap bead in an empty position on the micro-cavity array surface; placing the auxiliary microstructure polymer template spread with the liquid polymer film on the gap bead on the micro-cavity array surface, maintaining this state, and feeding the auxiliary microstructure polymer template into a vacuum drying oven; and heating and solidifying the liquid (Continued)

polymer film, and separating the micro-cavity array surface to obtain the micro-cavity array surface with the inclined smooth bottom surface.

7 Claims, 2 Drawing Sheets

(52) U.S. Cl.
CPC ...... *B81C 1/00063* (2013.01); *B81C 1/00071* (2013.01); *B81C 1/00079* (2013.01); *B81C 1/00103* (2013.01); *B81C 1/00119* (2013.01); *B81C 1/00388* (2013.01); *B81C 1/00444* (2013.01); *B81C 1/00531* (2013.01); *B81C 2201/0102* (2013.01); *B81C 2201/0132* (2013.01)

(56) References Cited

FOREIGN PATENT DOCUMENTS

| | | |
|---|---|---|
| CN | 101481079 | 1/2011 |
| CN | 103030099 | 4/2013 |
| CN | 107089635 | 8/2017 |
| CN | 107176588 | 9/2017 |
| CN | 112299363 | 2/2021 |

OTHER PUBLICATIONS

"International Search Report (Form PCT/ISA/210)" of PCT/CN2021/090483, dated Jul. 26, 2021, pp. 1-4.

"Written Opinion of the International Searching Authority (Form PCT/ISA/237)" of PCT/CN2021/090483, dated Jul. 26, 2021, pp. 1-5.

* cited by examiner

METHOD FOR PREPARING MICRO-CAVITY ARRAY SURFACE PRODUCT WITH INCLINED SMOOTH BOTTOM SURFACE BASED ON AIR MOLDING METHOD

CROSS-REFERENCE TO RELATED APPLICATION

This application is a 371 of international application of PCT application serial no. PCT/CN2021/090483, filed on Apr. 28, 2021, which claims the priority benefit of China application no. 202011048792.1, filed on Sep. 29, 2020. The entirety of each of the above mentioned patent applications is hereby incorporated by reference herein and made a part of this specification.

TECHNICAL FIELD

The present invention relates to the technical field of functional surface preparation, in particular to a method for preparing a micro-cavity array surface product with an inclined smooth bottom surface based on an air molding method. The method is suitable for preparing a polymer micro-cavity array surface product with an inclined smooth bottom surface, especially suitable for preparing a micro-cavity array surface product with an inclined smooth bottom surface under simple conditions.

DESCRIPTION OF RELATED ART

A micro-cavity array surface product with an inclined smooth bottom surface refers to a micro-cavity surface product with an inclined smooth bottom surface at the bottom of the surface micro-cavity. The micro-cavity array surface product can be used as a texture friction pair, and can also be used to guide directional movement of liquid droplets. It has attracted wide attention in recent years due to its potential application value.

The surface quality of the bottom is of great significance for the micro-cavity array surface product with an inclined smooth bottom surface. However, it is difficult to guarantee the surface quality through machining and chemical etching since the micro-cavity is in microscale. In order to prepare a micro-cavity with an inclined bottom surface, diamond grinding tools are generally used, through which it is difficult to control the opening shape of the micro-cavity or guarantee a quality of the ground surface. An air molding method (ZL200910024713.0) is used for forming a polymer material with the micro-cavity shape controlled by adjusting air pressure, which can be used to prepare micro-nano lenses. A micro-cavity shape formed through the method has desirable flexibility. Through analysis, it is found that through the air molding method, growing bubbles show certain adhesion when encountering a solid wall, a formed shape has features of the bubbles controlling an initial shape of the micro-cavity, and has feature of the wall limiting growth of the bubbles, and a polymer formed can also play a role of the smooth limiting wall. In this way, if the limiting wall is arranged as an inclined surface, the micro-cavity with an inclined smooth bottom surface can be prepared.

In summary, it is possible to prepare the micro-cavity array surface product with an inclined smooth bottom surface by combining the air molding method with a template with an inclined structure. In order to prepare the micro-cavity array surface product with an inclined smooth bottom surface, the present invention provides a method for preparing a micro-cavity array surface product with an inclined smooth bottom surface based on an air molding method.

SUMMARY

An objective of the present invention is to provide an air molding method based on pre-spreading of an auxiliary microstructure polymer template for preparing a micro-cavity array surface product with an inclined smooth bottom surface, which realizes controllable preparation of a polymer material micro-cavity array surface product with an inclined smooth bottom surface under simple conditions.

The present invention is achieved through the following technical solution.

An air molding method based on pre-spreading of an auxiliary microstructure template for preparing a micro-cavity array surface product with an inclined smooth bottom surface includes the following steps:

(1) preparing a micro-cavity array surface; and preparing an auxiliary microstructure polymer template, and performing a plasma treatment on the auxiliary microstructure polymer template;

(2) uniformly spreading a layer of a liquid polymer film to be formed on the auxiliary microstructure polymer template subjected to the plasma treatment, and placing a gap bead in an empty position on the micro-cavity array surface;

(3) placing the auxiliary microstructure polymer template spread with the liquid polymer film on the gap bead on the micro-cavity array surface, maintaining this state, and feeding the auxiliary microstructure polymer template into a vacuum drying oven;

and (4) setting a pressure in the vacuum drying oven according to a designed pressure, heating and solidifying the liquid polymer film, and separating the micro-cavity array surface to obtain the micro-cavity array surface product with the inclined smooth bottom surface.

In step (1), the micro-cavity array surface is prepared by a conventional micromachining method such as a laser direct writing machining method, wherein a laser spot used has a diameter of 5 μm to 100 μm, an overlap rate of the laser spot during scanning falls within 30%-90%, a micro-cavity zone to be machined is subjected to surface scanning 5-20 times, a prepared micro-cavity has a depth greater than a width of the micro-cavity, and the prepared micro-cavity is a closed cavity, and has a special-shaped or even rectangular opening.

In step (1), the preparing of the auxiliary microstructure polymer template, and the performing of the plasma treatment on the auxiliary microstructure polymer template specifically includes: preparing a through groove array with an inclined bottom by micro-imprinting or diamond grinding, duplicating the prepared through groove array with the inclined bottom surface through a replica molding method, and further using a plasma treatment apparatus to perform the plasma treatment on a surface of the duplicated through groove array to improve a surface energy, wherein a plasma used has a radio frequency of 13.56 MHz, and has a power of 100 W-600 W, and the plasma treatment is conducted for 10 s to 600 s.

In step (2), the uniform spreading of the layer of the liquid polymer film to be formed on the auxiliary microstructure polymer template subjected to the plasma treatment specifically includes: dripping a liquid polymer material polydimethylsiloxane (PDMS) on the treated auxiliary microstructure polymer template, spreading the polymer with a required thickness, and controlling, by a spin coater, a thickness of the polymer film obtained by spreading the polymer material, a spinning speed of the spin coater being 200 rpm to 4,000 rpm, a spin coating time being 10 s to 60 s, a thickness of the polymer film being 1-100 μm, and a spreading area of the polymer material being configured for completely covering the micro-cavity array surface.

In step (2), the placing of the gap bead in the empty position on the micro-cavity array surface specifically includes: preparing gap beads with a diameter equaling a thickness of the polymer film, placing the gap beads in three empty positions near an edge of the micro-cavity array surface, and specifically, placing 5-100 gap beads in each of the three positions, the three positions for the gap beads to be placed being scattered, and lines between the three positions forming an acute triangle.

In step (3), the placing of the auxiliary microstructure polymer template spread with the liquid polymer film on the gap bead on the micro-cavity array surface, the maintaining of this state, and the feeding of the auxiliary microstructure polymer template into the vacuum drying oven specifically includes: placing the auxiliary microstructure polymer template spread with the liquid polymer film on the gap bead on the micro-cavity array surface, making the liquid polymer come into contact with the micro-cavity array surface, simultaneously observing, through a microscope, whether the auxiliary microstructure polymer template is aligned with the micro-cavity array surface in real time, aligning a microstructure on the template with a cavity on the micro-cavity array surface by adjusting the auxiliary microstructure polymer template, finally achieving liquid seal on air in microcavities, keeping the micro-cavity array surface horizontal in subsequent operations, so as to limit flow of the liquid polymer film, and keeping the liquid polymer film and the micro-cavity array surface in full contact and at a horizontal state, and feeding the liquid polymer film and the micro-cavity array surface into the vacuum drying oven for later treatment.

In step (3), the setting of the pressure in the vacuum drying oven according to the designed pressure, the heating and solidifying of the liquid polymer film, and the separating of the surface to obtain the micro-cavity array surface product with the inclined smooth bottom surface specifically includes: calculating the pressure P of the vacuum drying oven according to a depth h of a micro-cavity and a thickness $h_1$ of the polymer film, wherein $h_1 P_0/(h+h_1)-4\sigma/h_1 < P < P_0 - hP_0/(h+2h_1/3)$, $P_0$ is an atmospheric pressure and σ is a surface tension of a formed material, vacuumizing the vacuum drying oven to the calculated pressure P; adjusting a temperature to 60° C. and performing a heat preservation for 2 hours to solidify the formed polymer film; and performing natural cooling after solidification, and separating the prepared micro-cavity array surface product with an inclined smooth bottom surface attached to the auxiliary microstructure polymer template from the micro-cavity template.

The present invention has the following advantages.

The liquid polymer is pre-spread through the auxiliary microstructure template, such that the prepared surface has shape features of a bottom of the auxiliary microstructure polymer template and shape features of the opening of the micro-cavity template through the air molding method.

An unsmooth structure on the auxiliary microstructure polymer template is completely filled with a formed polymer through formation via the air molding method, thereby effectively improving a quality of the micro-cavity surface.

DESCRIPTION OF THE EMBODIMENTS

Figure 1:
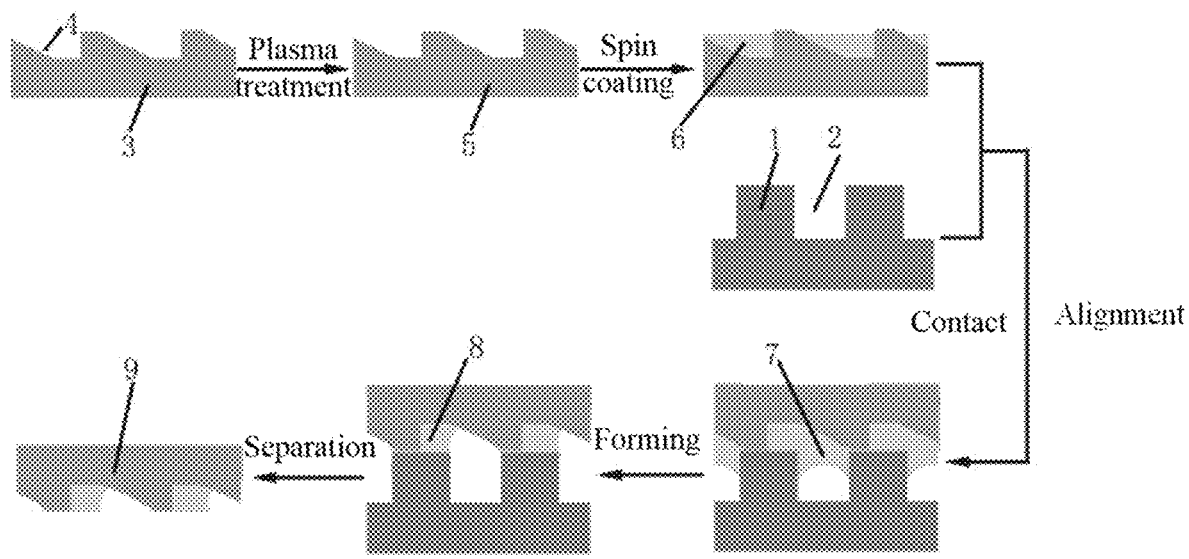
FIG. 1 is an implementation flow of a method for preparing a micro-cavity array surface product with an inclined smooth bottom surface based on an air molding method.
Figure 2:
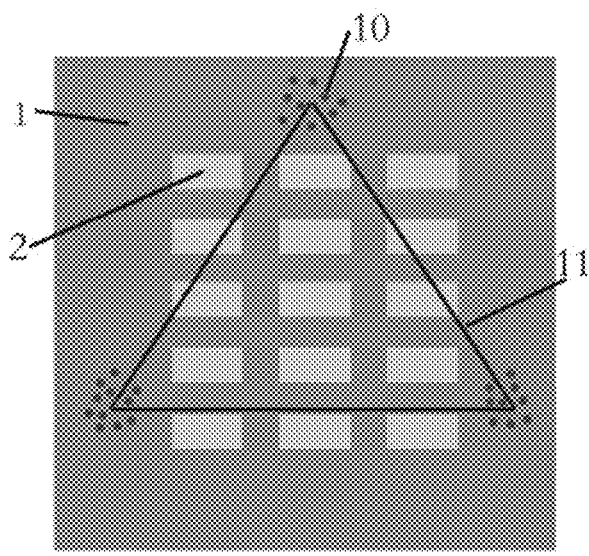
FIG. 2 is a placement manner of a gap bead on a micro-cavity surface.
Figure 3:
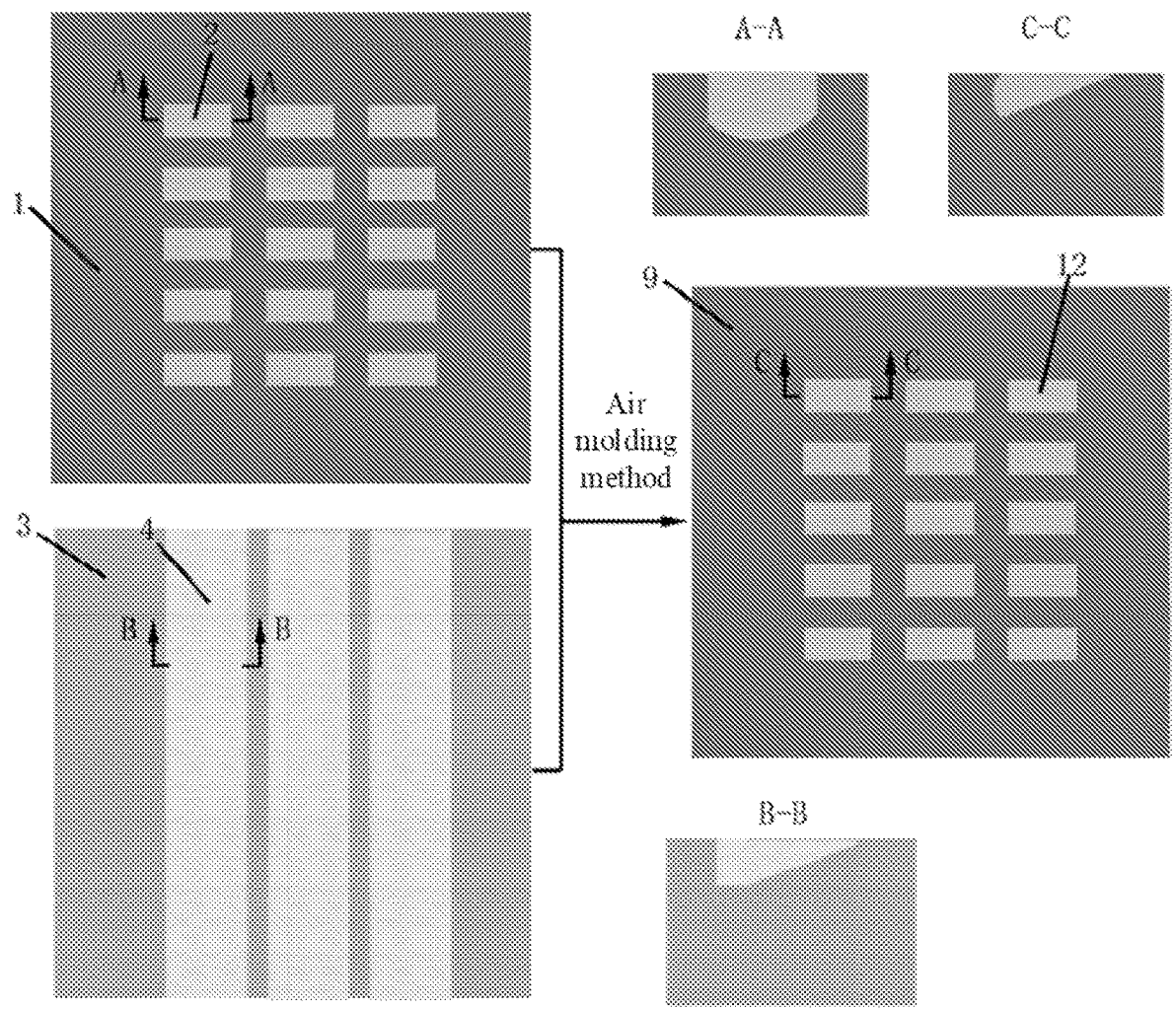
FIG. 3 is structural schematic diagrams of a template and a final prepared sample.

The following describes implementation details and working conditions of a specific technology provided by the present invention with reference to FIGS. 1-3.

As shown in FIG. 1, an air molding method based on pre-spreading of an auxiliary microstructure template for preparing a micro-cavity array surface product with an inclined smooth bottom surface mainly includes five steps: a micro-cavity array surface is prepared; an auxiliary microstructure polymer template is prepared, and plasma treatment is performed on the microstructure polymer template to improve surface energy; a formed liquid polymer is pre-spread on the auxiliary microstructure polymer template; the spread formed liquid polymer is made to come into contact with the micro-cavity array surface to form liquid seal; and vacuumforming, solidifying and separating are performed on the formed polymer, so as to prepare the micro-cavity through the air molding method.

Firstly, the micro-cavity array surface 1 can be prepared by a certain method, the surface may be prepared through conventional micro-machining methods such as a laser direct writing machining method and a photoetching machining method, and a prepared micro-cavity has a depth greater than the width of the micro-cavity. When laser direct writing machining method is used, a laser beam directly acts on a smooth surface, such that a material of a local zone of the smooth surface may be removed, and a specific cavity may be obtained by repeatedly removing the material and controlling the laser beam to scan a specific path. When the photoetching machining method is used, firstly, a mask plate is customized, and then a certain smooth base material is coated with photoresist, and then a pattern of the mask plate is projected onto the photoresist through a photoetching exposure system, such that a performance of the photoresist changes, and the micro-cavity array surface is obtained through subsequent technologies such as development, hard baking, corrosion and photoresist removal.

Secondly, the auxiliary microstructure polymer template 3 is prepared, a template groove 4 is formed in the auxiliary microstructure polymer template 3, and plasma treatment is performed on the microstructure template to improve the surface energy, so as to obtain the auxiliary microstructure polymer template 5 subjected to the plasma treatment. A process of preparing the auxiliary microstructure polymer template includes: firstly, a through groove array with an inclined bottom is prepared by micro-imprinting or diamond grinding, and then the prepared through groove array with the inclined bottom is duplicated through a replica molding method.

Thirdly, a formed polymer liquid 6 is pre-spread on the auxiliary microstructure polymer template 5 subjected to the plasma treatment. The auxiliary microstructure polymer template 5 subjected to the plasma treatment is coated with a layer of formed polymer liquid 6 with the thickness of 1-100 μm through a spin coater, and in the case of a liquid polymer, the micro-formed polymer liquid 6 (with a volume of 1 μL<V<100 μL) is poured onto the auxiliary microstructure polymer template 5 subjected to the plasma treatment, and the liquid polymer film is spread with a required thickness (1-100 μm) through the spin coater.

Fourthly, the spread formed polymer liquid 6 is made to come into contact with the micro-cavity array surface 1 to form the liquid seal. Gap beads 10 with a diameter equaling the thickness of the formed polymer liquid 6 are prepared, the gap beads 10 are placed in three empty positions near an edge of the micro-cavity array surface 1, and as shown in FIG. 2, specifically, 5-100 gap beads are placed in each position, the three positions for the gap beads 10 to be placed being scattered, and lines between the three positions forming an acute triangle 11 among the gap beads. Then, after being subjected to the plasma treatment, the auxiliary microstructure polymer template 5, on which the formed polymer liquid 6 is spread, is placed on the gap bead, such that the spread formed polymer liquid 6 is in contact with the micro-cavity array surface 1. At this time, the liquid formed polymer forms a specific shape under the action of surface tension and air pressure, that is, a formed polymer liquid 7 between the auxiliary microstructure polymer template 5 subjected to the plasma treatment and the micro-cavity array surface 1 is formed. Furthermore, whether the auxiliary microstructure polymer template and the micro-cavity array surface is aligned is observed in real time through a microscope, and the template groove 4 on the template is aligned with a micro-cavity 2 on the micro-cavity array surface by adjusting the auxiliary microstructure polymer template, such that residual air inside the micro-cavity is sealed by the polymer.

Fifthly, vacuum forming, solidifying and separating are performed on the formed polymer, so as to prepare the micro-cavity through the air molding method. The micro-cavity array surface 1 in the previous step is kept being horizontally placed and fed into a vacuum drying oven together with the formed polymer liquid 7 between the auxiliary microstructure polymer template and the micro-cavity array surface and the auxiliary microstructure polymer template 5 subjected to the plasma treatment, and the pressure P of the vacuum drying oven is calculated according to the depth h of the micro-cavity 2 and the thickness $h_1$ of the polymer liquid 6, wherein $hP_0/(h+h_1)-4\sigma/h_1<P<hP_0/(h+2h_1/3)$, $P_0$ is the atmospheric pressure and $\sigma$ is the surface tension of the formed polymer, and the vacuum drying oven is vacuumized to the calculated pressure P, so as to convert the formed polymer liquid into a formed polymer liquid 8 subjected to vacuumizing. The temperature is adjusted to 60° C. and heat preservation is performed for 2 hours to solidify the formed polymer liquid 7 between the auxiliary microstructure polymer template and the micro-cavity array surface, and natural cooling is performed after solidification, and the prepared micro-cavity array surface product 9 with the smooth and inclined bottom surface attached to the auxiliary microstructure polymer template is separated from the micro-cavity array surface 1, wherein the micro-cavity array surface product is provided with the inclined smooth bottom surface micro-cavity 12 array. As shown in FIG. 3, the inclined smooth bottom surface micro-cavity 12 (section C-C) of the micro-cavity array surface product 9 with the inclined smooth bottom surface has a feature (section A-A) of a micro-cavity opening of the micro-cavity array surface and a feature (section B-B) of a bottom of the auxiliary microstructure template.

Embodiment 1 (a formed polymer liquid 6 is polydimethylsiloxane (PDMS), an auxiliary microstructure polymer template 3 is a polydimethylsiloxane (PDMS) template, a micro-cavity array surface is a micro-cavity 1060 aluminum plate surface, and a gap bead is a polystyrene (PS) bead with the diameter of 20 μm)

The ordinary micro-cavity array surface 1 is prepared through laser direct writing machining, in which a substrate surface selects 1060 aluminum plate, a laser spot used has a diameter of 20 μm, an overlap rate of the laser spot during scanning is 50%, that is, a distance between two consecutive spots is 10 μm, and a micro-cavity zone to be machined is subjected to surface scanning 10 times, and the micro-cavity machined is a rectangular cavity with the width of 50 μm, the depth of 100 μm, the cavity length of 100 μm and the period of 150 μm. A through groove array with an inclined bottom surface having the width of 100 μm, the maximum depth of 20 μm and the period of 150 μm is machined on the 1060 aluminum plate with a diamond grinding tool. The foregoing through groove array with the inclined bottom surface is duplicated into a polydimethylsiloxane (PDMS, purchased from Dow Corning Company, USA, trade name Sylgard 184A) template for the through groove array with the inclined bottom surface by a replica molding method. The prepared PDMS template for the through groove array with the inclined bottom surface is placed in the plasma atmosphere for the plasma treatment, where in a plasma used has a radio frequency of 13.56 MHz, and has a power of 200 W, and the plasma treatment is conducted for 20 s, and a structureless surface of the treated PDMS template is attached to a flat silicon wafer, so as to improve the rigidity of the template. Then, 50 μL of the formed polymer PDMS is dripped on the PDMS template, the silicon wafer is rotated at 1,000 rpm through a spin coater, and then the auxiliary microstructure PDMS template coated with a liquid PDMS film may be obtained. The prepared micro-cavity 1060 aluminum plate is placed horizontally, and 10 PS beads with the diameter of 20 μm are placed at each of three empty positions at an edge of the micro-cavity 1060 aluminum plate, then the PDMS auxiliary microstructure template, on which the liquid PDMS film is spread, is placed on the gap bead, such that the residual air inside the micro-cavity is sealed by the PDMS film. The micro groove aluminum plate 1060 in a horizontal state is, together with the PDMS auxiliary microstructure template and the liquid PDMS, are fed into a vacuum drying oven, the pressure in the vacuum drying oven is set at 85,000 Pa, vacuumizing is performed according to the pressure, heating is performed to 60° C., heat preservation is kept for 2 hours, then natural cooling is performed, and the polymer film is separated from the micro-cavity array surface, thus obtaining a micro-cavity array surface product with an inclined smooth bottom surface having the width of 50 μm and the maximum depth of 20 μm.

What is claimed is:

1. An air molding method based on pre-spreading of an auxiliary microstructure template for preparing a micro-cavity array surface product with an inclined bottom surface, comprising the following steps:

step 1, preparing a micro-cavity array surface, and preparing an auxiliary microstructure polymer template, and performing a plasma treatment on the auxiliary microstructure polymer template;

step 2, spreading a layer of a liquid polymer film to be formed on the auxiliary microstructure polymer template subjected to the plasma treatment, and placing a gap bead in an empty position on the micro-cavity array surface;

step 3, placing the auxiliary microstructure polymer template spread with the liquid polymer film on the gap bead on the micro-cavity array surface, maintaining this state, and feeding the auxiliary microstructure polymer template into a vacuum drying oven; and step 4, setting a pressure in the vacuum drying oven according to a designed pressure, heating and solidifying the liquid polymer film, and removing the micro-cavity array surface to obtain the micro-cavity array surface product with the inclined bottom surface.

2. The air molding method based on pre-spreading of the auxiliary microstructure template for preparing the micro-cavity array surface product with the inclined bottom surface according to claim 1, wherein in the step 1, the micro-cavity array surface is prepared by a laser direct writing machining method or a photoetching machining method, wherein in the laser direct writing machining method, a laser spot used has a diameter of 5 μm to 100 μm, an overlap rate of the laser spot during scanning falls within 30%-90%, a micro-cavity zone to be machined is subjected to surface scanning 5-20 times, a prepared micro-cavity has a depth greater than a width of the micro-cavity, and the prepared micro-cavity is a closed cavity, and has a special-shaped or even rectangular opening.

3. The air molding method based on pre-spreading of the auxiliary microstructure template for preparing the micro-cavity array surface product with the inclined bottom surface according to claim 1, wherein in the step 1, the preparing of the auxiliary microstructure polymer template, and the performing of the plasma treatment on the auxiliary microstructure polymer template comprises: preparing a through groove array with an inclined bottom by micro-imprinting or diamond grinding, duplicating the prepared through groove array with the inclined bottom surface through a replica molding method, and using a plasma treatment apparatus to perform the plasma treatment on a surface of the duplicated through groove array to improve a surface energy, wherein a plasma used has a radio frequency of 13.56 MHz, and has a power of 100 W-600 W, and the plasma treatment is conducted for 10 s to 600 s.

4. The air molding method based on pre-spreading of the auxiliary microstructure template for preparing the micro-cavity array surface product with the inclined bottom surface according to claim 1, wherein in the step 2, the spreading of the layer of the liquid polymer film to be formed on the auxiliary microstructure polymer template subjected to the plasma treatment comprises: dripping a liquid polymer material polydimethylsiloxane on the treated auxiliary microstructure polymer template, spreading the polymer with a required thickness, and controlling, by a spin coater, a thickness of the polymer film obtained by spreading the polymer material, a spinning speed of the spin coater being 200 rpm to 4,000 rpm, spin coating time being 10 s to 60 s, a thickness of the polymer film being 1-100 μm, and a spreading area of the polymer material being configured for completely covering the micro-cavity array surface.

5. The air molding method based on pre-spreading of the auxiliary microstructure template for preparing the micro-cavity array surface product with the inclined bottom surface according to claim 1, wherein in the step 2, the placing of the gap bead in the empty position on the micro-cavity array surface comprises: preparing the gap beads with a diameter equaling a thickness of the polymer film, placing the gap beads in three empty positions near an edge of the micro-cavity array surface, wherein, placing 5-100 gap beads in each of the three positions, the three positions for the gap beads to be placed being scattered, and lines between the three positions forming an acute triangle.

6. The air molding method based on pre-spreading of the auxiliary microstructure template for preparing the micro-cavity array surface product with the inclined bottom surface according to claim 1, wherein in the step 3, the placing of the auxiliary microstructure polymer template spread with the liquid polymer film on the gap bead on the micro-cavity array surface, the maintaining of this state, and the feeding of the auxiliary microstructure polymer template into the vacuum drying oven comprises: placing the auxiliary microstructure polymer template spread with the liquid polymer film on the gap bead on the micro-cavity array surface, making the liquid polymer come into contact with the micro-cavity array surface, simultaneously observing, through a microscope, whether the auxiliary microstructure polymer template is aligned with the micro-cavity array surface in real time, aligning a microstructure on the template with a microcavity on the micro-cavity array surface by adjusting the auxiliary microstructure polymer template, finally achieving liquid seal on air in the microcavities, keeping the micro-cavity array surface horizontal in subsequent operations, so as to limit flow of the liquid polymer film, and keeping the liquid polymer film and the micro-cavity array surface in full contact and at a horizontal state, and feeding the liquid polymer film and the micro-cavity array surface into the vacuum drying oven for later treatment.

7. The air molding method based on pre-spreading of the auxiliary microstructure template for preparing the micro-cavity array surface product with the inclined bottom surface according to claim 1, wherein in the step 3, the setting of the pressure in the vacuum drying oven according to the designed pressure, the heating and solidifying of the liquid polymer film, and the removing of the surface to obtain the micro-cavity array surface product with the inclined bottom surface comprises: calculating the pressure P of the vacuum drying oven according to a depth h of a micro-cavity and a thickness $h_1$ of the polymer film, wherein $h_1 P_0/(h+h_1)-4\sigma/h_1 < P < P_0 - hP_0/(h+2h_1/3)$, $P_0$ is an atmospheric pressure and $\sigma$ is a surface tension of a formed material; vacuumizing the vacuum drying oven to the calculated pressure P; adjusting a temperature to 60° C. and performing heat preservation for 2 hours to solidify the formed polymer film; and performing natural cooling after solidification, and separating the prepared micro-cavity array surface product with the inclined bottom surface attached to the auxiliary microstructure polymer template from the microstructure template.

* * * * *